United States Patent [19]

Van Kempen et al.

[11] Patent Number: 5,796,102

[45] Date of Patent: Aug. 18, 1998

[54] MEASURING DEVICE FOR MEASURING THE INTENSITY AND/OR POLARIZATION OF ELECTROMAGNETIC RADIATION, FOR DETERMINING PHYSICAL PROPERTIES OF A PREPARATION, AND FOR READING INFORMATION FROM A STORAGE MEDIUM

[75] Inventors: Herman Van Kempen; Daniel Lee Abraham; Menno W. J. Prins; Ronald Jansen, all of Nijmegen; Maurice C. M. M. van der Wielen, Nistelrode, all of Netherlands

[73] Assignee: Stichting Katholieke Universiteit Nijmegen, Nijmegen, Netherlands

[21] Appl. No.: 619,643

[22] PCT Filed: Sep. 16, 1994

[86] PCT No.: PCT/NL94/00227

§ 371 Date: Oct. 15, 1996

§ 102(e) Date: Oct. 15, 1996

[87] PCT Pub. No.: WO95/08109

PCT Pub. Date: Mar. 23, 1995

[30] Foreign Application Priority Data

Sep. 17, 1993 [NL] Netherlands .......................... 9301617

[51] Int. Cl.[6] ..................................................... H01J 37/00
[52] U.S. Cl. ........................................ 250/306; 250/307
[58] Field of Search ............................... 250/306, 307, 250/423 F

[56] References Cited

U.S. PATENT DOCUMENTS

| 4,985,627 | 1/1991 | Gutierrez et al. | 250/306 |
|---|---|---|---|
| 5,105,305 | 4/1992 | Betzig et al. | 359/368 |
| 5,138,159 | 8/1992 | Takase et al. | 250/306 |
| 5,198,666 | 3/1993 | Glembocki et al. | 250/306 |

FOREIGN PATENT DOCUMENTS

| 0 355 241 | 2/1988 | European Pat. Off. . |
|---|---|---|
| 41 24 090 | 1/1992 | Germany . |
| 62-139240 | 6/1987 | Japan . |

OTHER PUBLICATIONS

Sueoka, et al., "Possibility of Observing Spin-Polarized-Tunneling Current Using Scanning Tunneling Microscope with Optically Pumped GaAs", *Japan Journal of Applied Physics*, vol. 32, (1993), pp. 2989-2993.

Hasan, et al., "Scanning tunneling microscope as a high sensitivity radiation detector", *Review of Scientific Instruments*, vol. 63, No. 3, Jun. 1994, New York, USA, pp. 2099-2100.

Jansen, et al., "Progress toward spin-sensitive scanning tunneling microscopy using optical orientation in GaAs", *Journal of Vaccum Science and Technology*, Part B, vol. 12, No. 3, Jun. 1994, New York, USA, pp. 2133-2135.

Prins, et al., "Photoamperic probes in scanning tunneling microscopy", *Applied Physics Letters*, vol. 64, No. 10, Mar. 7, 1994, New York, USA, pp. 1207-1209.

*Primary Examiner*—Bruce Anderson
*Attorney, Agent, or Firm*—Merchant, Gould, Smtih, Edell, Welter & Schmidt

[57] ABSTRACT

A measuring device for measuring the intensity and/or polarization of electromagnetic radiation, more in particular of light. The measuring device is provided with a tunnel tip arranged facing a body at some distance, which tunnel tip at least partly consists of a semiconductor material. The measuring device further comprises a control unit for obtaining information about the intensity and/or polarization of the radiation by means of a tunnel current, generated under the influence of the radiation in the tunnel tip, between the tunnel tip and the body and/or a surface photovoltage of the tunnel tip, generated under the influence of the radiation.

35 Claims, 3 Drawing Sheets

MEASURING DEVICE FOR MEASURING THE INTENSITY AND/OR POLARIZATION OF ELECTROMAGNETIC RADIATION, FOR DETERMINING PHYSICAL PROPERTIES OF A PREPARATION, AND FOR READING INFORMATION FROM A STORAGE MEDIUM

BACKGROUND OF THE INVENTION

This invention relates to a measuring device for measuring the intensity and/or polarization of electromagnetic radiation, more in particular of light. Such measuring devices are known in many variants. In this connection, for instance, CCDs often used in video cameras may be thought of, for one thing, and microscopes, for another. There is, however, a need for a measuring device capable of measuring electromagnetic fields having a very low intensity. Moreover, the resolution of the measuring device should be less than the wavelength of the electromagnetic radiation. This enables details, such as geometric, electric and magnetic properties of a preparation, to be observed on a submicron or even a nanometer scale.

SUMMARY OF THE INVENTION

A measuring device according to this invention is characterized by providing the measuring device with a tunnel tip arranged facing a body at some distance, which tunnel tip at least partly consists of a semiconductor material and a control unit for obtaining information about the intensity and/or polarization of the radiation by means of a tunnel current, generated under the influence of the radiation in the tunnel tip, between the tunnel tip and the body and/or a surface photovoltage of the tunnel tip, generated under the influence of the radiation. Surprisingly, it has been found that radiation having only a power of 1 mW per mm$^2$ at the place of incidence on the tunnel tip already results in a properly observable tunnel current and/or surface photovoltage. In this connection, for instance, a tunnel current on an order of magnitude of 500 pA and/or a surface photovoltage of 500 mV may be thought of.

According to a special embodiment the body, in use, comprises a preparation emitting radiation the intensity and/or polarization of which is determined by the measuring device. The radiation of the preparation detected by the measuring device may then provide relevant physical information about the preparation. More in particular, the above intensity and/or polarization of the radiation is determined for obtaining physical information from the preparation. The manner in which physical information from a preparation can be obtained from the tunnel current and/or surface photovoltage is known per se, is not relevant to the invention, and will therefore not be explained in detail.

According to a special embodiment the measuring device is further provided with a radiation source from which electromagnetic radiation is emitted in the direction of the tunnel tip for measuring the intensity and/or polarization of the radiation emitted. There can thus be obtained information about the radiation source itself.

According to an alternative embodiment of the measuring device the body, in use, comprises a preparation to be investigated, the measuring device further being provided with a radiation source with which electromagnetic radiation is emitted in the direction of the preparation. This radiation emitted will in general undergo an interaction with the preparation which, inter alia, depends on physical properties of the preparation, such as, for instance, the geometry of the preparation and magnetic and/or electric properties of the preparation. The changes experienced by the radiation, such as, for instance, a change of intensity and/or polarization, can be measured very accurately by the measuring device and are subsequently correlated with the above properties of the preparation.

According to a variant of the invention, the preparation is located between the tunnel tip and the radiation source so that the intensity and/or polarization of radiation transmitted by the preparation is measured for determining physical properties of the preparation.

According to another variant the radiation source and the tunnel tip are located on the same side of the preparation so that the intensity and/or polarization of radiation at least partly reflected by the preparation is measured for determining physical properties of the preparation. In particular, near-field optical microscopy can be practiced with both variants. In this use, the distance between the tunnel tip and the body is selected to be smaller than the wavelength of the radiation.

According to an advanced embodiment of the measuring device according to the invention, the tunnel tip is provided with polarization-sensitive means for measuring a predetermined polarization component of the radiation with the tunnel tip. Thus the measuring device can be used as a polarization-selective near-field optical detector. According to a special embodiment the tunnel tip is partly provided for this purpose with a metallic portion, more in particular a metallic coating functioning as a means sensitive to polarization.

According to another aspect of the invention the control unit regulates the surface photovoltage within predetermined limits. This surface photovoltage is determined, inter alia, by the distance to be adjusted between tunnel tip and body and the magnitude of the tunnel current. This ensures optimum sensitivity of the tunnel tip.

According to another aspect of the invention the control unit generates a bias between the body and the tunnel tip. Thus the tunnel current can be regulated in such a region that in particular small variations in the radiation can be properly measured as variations in the tunnel current and/or surface photovoltage. Accordingly, this enables optimization of the sensitivy of the measuring device.

According to a another embodiment of the invention, the radiation source emits radiation of a specific wavelength. By selecting the wavelength of the radiation, interesting physical information in relation to a preparation can be obtained on physical grounds. According to another aspect of the invention the radiation source emits polarized radiation. If the polarization of the radiation is changed by a preparation, this can be properly measured with the measuring device according to the invention as described above. It will be appreciated that information about the magnetic and/or electric properties of a preparation can be obtained on the basis of this measurement. In particular, this information is obtained for the bulk of the preparation. According to another aspect of the invention the radiation source therefore emits linearly polarized radiation. According to an aspect of the invention the radiation source emits circularly polarized radiation. By interaction with the preparation the direction of polarization may be changed, and by measuring this change further information about the preparation can be derived. With circularly polarized radiation this means that, for instance, elliptically polarized radiation can be obtained, which depends on the electric and/or magnetic properties of the material, in particular of the bulk of the material.

Preferably, the radiation source is provided with a modulator for modulating the direction of polarization of the radiation, the control unit comprising a phase-sensitive detector for the phase-sensitive detection, in synchronization with the modulation, of the tunnel current and/or surface photovoltage. This considerably increases the polarization-sensitivity of the measuring device.

According to a special use of the invention the body is provided with a preparation of which magnetic and/or electric properties in the bulk of the preparation are determined by means of the tunnel current and/or surface photovoltage.

According to another advanced use of the measuring device according to the invention a preparation is used as a storage medium for information, in particular binary information, different regions of the preparation being scanned successively with the tunnel tip. Each region can assume an electric and/or magnetic state to be measured. The combination of the electric states of the different regions represent the information stored. In particular, each region only knows two different states so that a bit can be stored per region. According to the invention the lateral resolution, when the measuring device scans a preparation, is less than the wavelength used of the radiation source. Scanning can be effected in a manner known per se. The resolution is determined by the collection volume of the tunnel tip contributing to the tunnel current and/or surface photovoltage generation. By varying the transport properties of the tunnel tip, the above volume can be adapted. This means that tremendous amounts of information can be stored per square centimeter and can then be read. In this connection, for instance, 5 G Byte per square centimeter may be possible.

According to another use of the invention the measuring device is further provided with a control unit-controlled drive for positioning the tunnel tip at the above distance and for scanning the body which, in use, comprises a preparation to be investigated. The preparation to be investigated may also be a preparation the information of which should be read. In this connection, therefore, a preparation to be investigated also includes, in relation to the entire invention, an information carrier to be read. The measuring device can then be characterized in that the preparation to be investigated comprises an information storage medium, position-dependent magnetic and/or electric states of the preparation being measured during scanning, which represent the information stored.

Finally, it is observed that the distance between the tunnel tip and the body/preparation is preferably an order of magnitude of less than a wavelength of the radiation. Other values, however, are also possible. The tunnel tip can, in principle, be successfully manufactured from many types of semiconductor material, such as, for instance, Si, GaAs, superlattices and heterostuctures.

BRIEF DESCRIPTION OF THE DRAWINGS

The invention will be explained in detail with reference to the accompanying drawings in which.

DETAILED DESCRIPTION

Figure 1:
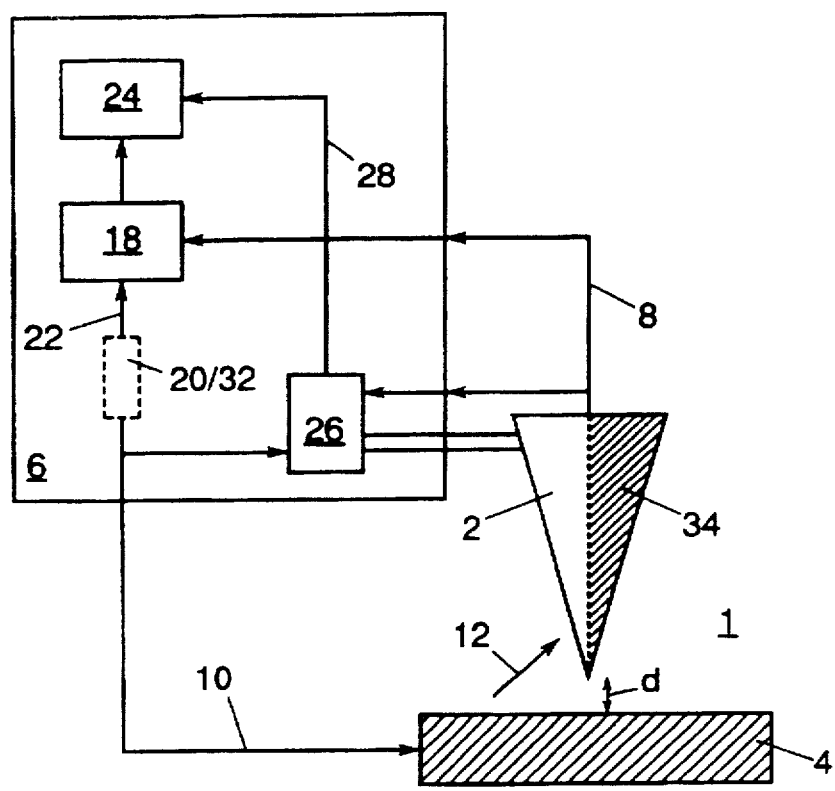
FIG. 1 shows a first embodiment of a measuring device according to the invention.

In FIG. 1 reference numeral 1 generally designates a measuring device according to the invention. The measuring device is provided with a tunnel tip 2. The tunnel tip 2 is provided with a semiconductor material which in this example is a semiconductor material such as, for instance, n- or p-doped gallium arsenide, but other semiconductor materials such as silicon may also be used. The tunnel tip may also comprise a combination of different materials. Thus, for instance, one or more semiconductors may be applied onto a metal substrate. In this example the tunnel tip 2 is cone-shaped, but other shapes are possible too.

A body 4 is placed at a distance d from the tunnel tip 2 and has the property that it can conduct current, and therefore comprises a conductor and/or a semiconductor. Besides, the measuring device is provided with a control unit 6 which is connected at least electrically via line 8 with the tunnel tip 2. The body 4 is also connected with the control unit via line 10.

Figure 2:
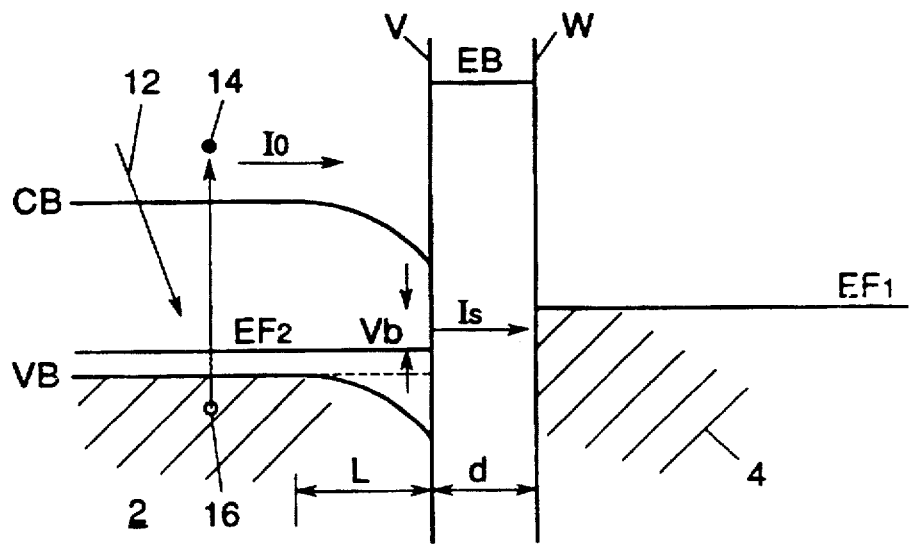
FIG. 2 is a schematic view of an energy band diagram of a tunnel tip arranged facing a body.

In operation, the measuring device functions as follows. Electromagnetic radiation 12, the intensity and/or polarization of which is to be determined, is incident on the semiconductor tip 2. As shown in FIG. 2, the semiconductor material of the tunnel tip comprises a valence band VB bending near the surface V of the semiconductor material. The conduction band CB also bends near the surface V of semiconductor material of the tunnel tip. Here at least a part of the semiconductor material is located at the outer surface of the tunnel tip. The band bending region is designated by L. The incident radiation has an energy E=h.f, in which h is Planck's constant and f the frequency of the incident radiation 12. When the frequency of the incident radiation is sufficiently high, an electron 14 of the valence band VB is raised to the conduction band CB, and an electron hole 16 is created in the valence band. Under the influence of the conduction band, bent downwards in this example, the electron 14 moves to the surface V of the semiconductor material. Thus a current Io is created to which only a limited region of the semiconductor (collection volume) contributes. (It will be appreciated that for semiconductor materials having a conduction band and valence band bent upwards a current can be created in a similar way.) This region is determined, inter alia, by transport parameters of the semiconductor. In this example the surface V of the semiconductor is at a distance d from the surface W of the body 4. In FIG. 2 the Fermi level of the body 4 is designated by $EF_1$ and the Fermi level of the tunnel tip 2 by $EF_2$. Between the tunnel tip 2 and the body 4 there is a potential barrier designated in FIG. 2 by EB. In FIG. 2 the potential difference between $EF_1$ and $EF_2$ is designated by Vb. In view of quantum-mechanical considerations a part of the electrons 14 will defy the potential barrier EB and flow to the body 4, resulting in a tunnel current Is. The control unit 6 measures the tunnel current Is via lines 8 and 10. The tunnel current Is thus comprises information about the radiation 12. In view of physical laws, which will not be explained here in detail, the tunnel current also comprises information about the polarization of the radiation 12. This involves that according to the invention information about the radiation 12 can be obtained with the measuring device of FIG. 1. Here it may be particularly interesting to correlate variations in the tunnel current Is and/or surface photovoltage with variations in the radiation 12. It is also possible with means known per se to measure this tunnel current and/or surface photovoltage and to regulate the same to a predetermined value by varying other parameters the size of which can be correlated with the above intensity and/or polarization of the radiation 12. The parameters to be varied may be, for instance, the distance between tunnel tip and body or the intensity of the radiation source. The variation of the parameters will often be carried out via a feedback circuit to regulate the tunnel current and/or surface photovoltage to a predetermined value.

In this example the control unit is provided with a detector 18 connected with the tunnel tip via line 8. Moreover, the control unit comprises a voltage source 20 adjusting the voltage Vb and stabilizing the same in this case via lines 10 and 22. The voltage Vb may be adjusted in dependence on the distance d and the physical properties of the body 4. The detector 18 measures the current Is and shows the result thereof on a display 24.

The radiation to be detected with the measuring device may originate from different sources. Thus, for instance, it is possible that the radiation is generated by a radiation source not shown, the radiation being detected with the purpose of obtaining information about the radiation of the source and/or information about the source itself. Besides, it is possible that the body 4 comprises a preparation or is completely built up from a preparation which, for any reason whatever, emits radiation. By measuring the intensity and/or polarization of this radiation 12 with the device, physical information about the preparation of the body 4 can be obtained. According to a special embodiment the control unit 6 is further provided with a drive for adjusting the distance d between the tunnel tip and the body 4. Besides, the body 4 can be scanned with the drive 26 by moving the tunnel tip along the surface W of the body. The position of the tunnel tip relative to the body 4 is passed on to the display 24 via line 28 so that there can be obtained a position-dependent picture of the tunnel current Is or other magnitudes connected therewith. In this connection it is observed that the distance d will preferably be much smaller than the wavelength of the radiation. By correlating the tunnel current Is, for instance with the geometry of the body, near-field microscopy can be practiced. The lateral resolution during scanning will then also be less than the wavelength. Since the absolute value of the tunnel current Is is a function of the distance d between the tunnel tip 2 and the surface W of the body, this distance can be regulated and, if necessary, kept constant by supplying the magnitude of the tunnel current via line 30 to the drive 26. Thus, for instance, the magnitude of the tunnel current is kept constant (measuring and regulating) by varying the vertical position of the tunnel tip during scanning so that the tunnel current remains constant. The vertical position of the tunnel tip is then a parameter capable of providing physical information about the body. The distance d will preferably be smaller than the wavelength of the radiation 12. This can be carried out with means known per se.

According to another embodiment of the control unit the voltage Vb is regulated to zero.

According to an advanced embodiment of the device the tunnel tip is partly provided at its outer surface with a metallic coating 34, schematically shown in FIG. 1 in hatching. Here at least a part of the semiconductor material of the tunnel tip is not covered with the metallic coating. This means that near the metallic coating 34 only electric components of radiation 12 can be measured that are perpendicular to the outer surface of the metallic coating. Thus the measuring device functions as a polarization-selective near-field detector. By carrying out at least three different measurements in which the tunnel tip has different directions, three different electric components are measured so that the polarization, that is to say magnitude and direction of the radiation can be determined. If the radiation relates to light, an optical detector of this type is therefore produced.

Figure 3:
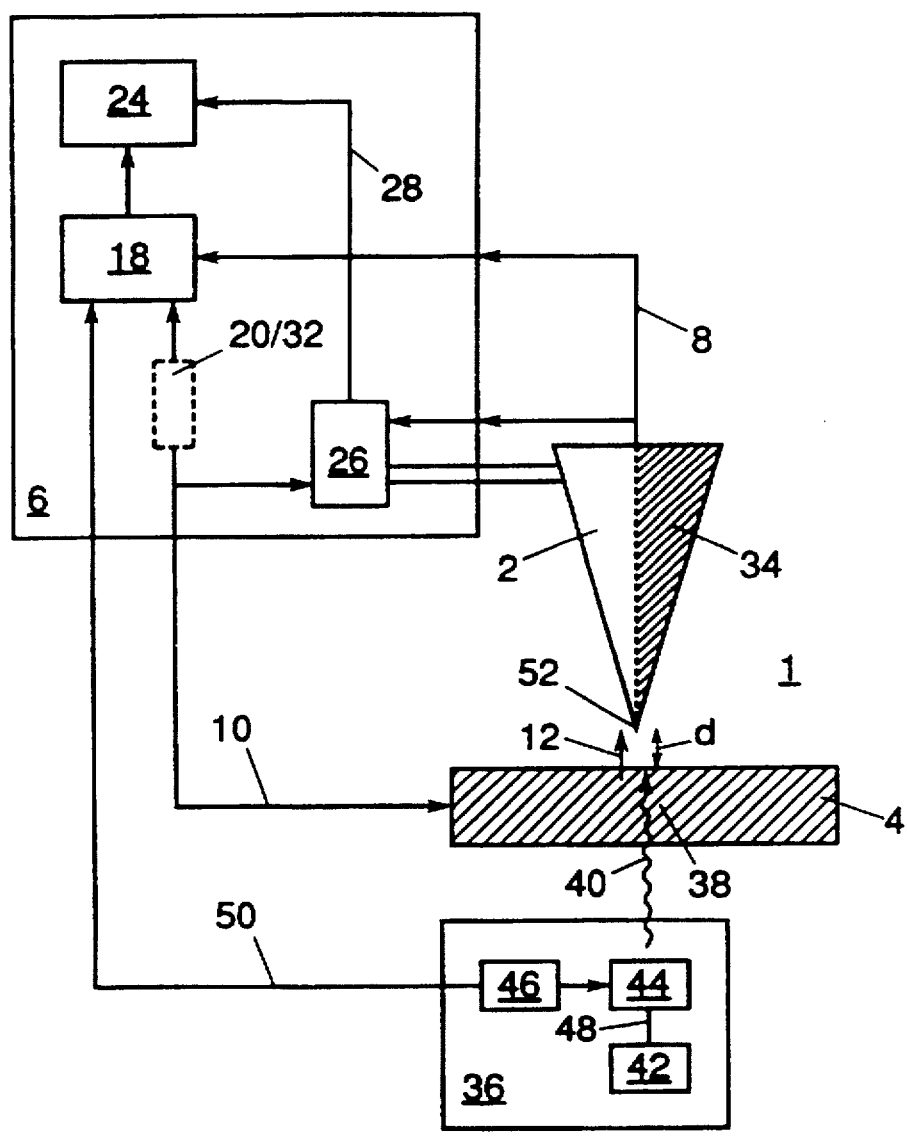
FIG. 3 shows a second embodiment of a measuring device according to the invention.

FIG. 3 shows another embodiment of the measuring device in which parts corresponding to the parts of FIG. 1 are designated by the same reference numeral. Moreover, this measuring device 1 is provided with a radiation source 36, the body 4 being placed between the radiation source 36 and the tunnel tip 2. In this example the body comprises a preparation 38 from which the physical information should be obtained. The radiation source emits radiation 40 which penetrates into the tunnel tip 2 via the preparation 38. The radiation 40 leaving the body is designated here by reference numeral 12. The radiation 12, however, contains physical information about the preparation 38 which can be determined by measuring the current Is or the surface photovoltage. Thus, for instance, the intensity of the radiation depends on the thickness of the preparation and, in case of polarized radiation, on electric and/or magnetic properties of the preparation. If the preparation 38 is scanned by the drive 26, information can be obtained about the thickness of the preparation and the geometry of the surface W of the preparation. If, however, the preparation has polarizing properties affecting the radiation 40, information can be obtained about these polarizing properties by the tunnel tip 2 provided with the coating 34. These properties prove to have a direct relation with the electric and magnetic properties of the preparation, both bulk and surface, and adsorbates, if any.

More in particular, the radiation source 36 comprises a laser 42, a polarizer 44, and, if required, a modulator 46. The laser 42 emits monochromatic radiation 48 to the polarizer 44. The polarizer 44 emits polarized radiation 40 in the direction of the preparation 38. The radiation can be linearly or circularly polarized in the known manner. If this polarized radiation shines through the preparation 38, the direction of polarization will change in dependence on the magnetic and electric properties of the preparation. The tunnel tip 2 provided with the metallic coating 34 is sensitive to polarization so that these changes of polarization can be measured because they are expressed in the current Is or surface photovoltage determined by the control unit 6. When the tunnel tip 2 is moved with the drive 26 along the surface W of the preparation 38, the magnetic and/or electric properties of the preparation can be mapped and shown on the display 42.

In particular, the radiation source 36 is provided with a modulator 46 which modulates the direction of polarization of the polarizer 44. In case of linear polarization this means, for instance, that the vectorial direction of polarization is changed while in case of circular polarization the direction of polarization is changed from levorotatory to dextrorotatory, and vice versa. Moreover, the modulator 46 is connected via line 50 with the detector 18 which now comprises a phase-sensitive detector. Because the current Is or surface photovoltage is phase-sensitively detected, the sensitivity of the measuring device will be improved further.

Figure 4:
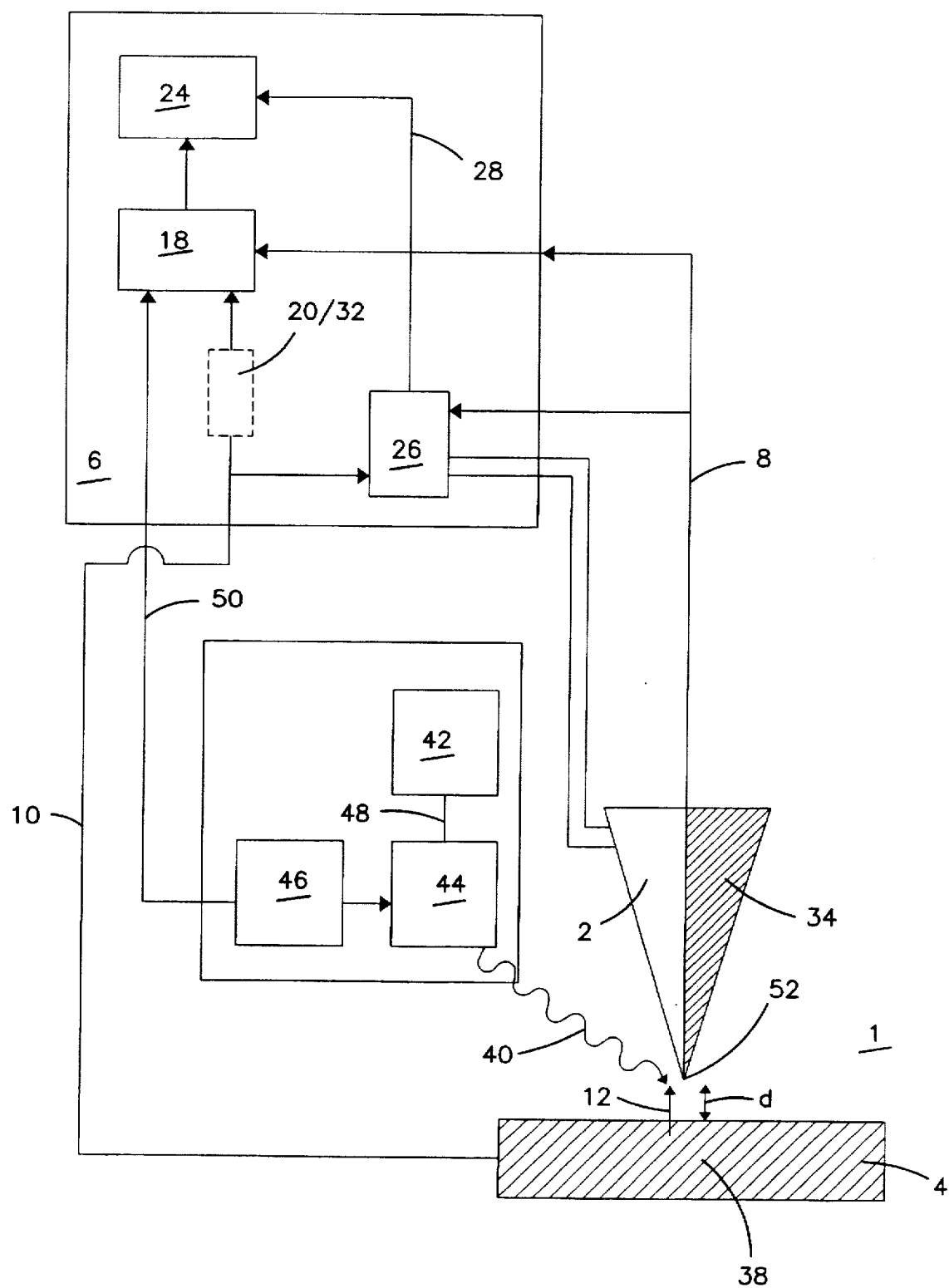
FIG. 4 shows another embodiment of the measuring device.

According to another embodiment illustrated in FIG. 4, the radiation source 36 and the tunnel tip 2 of FIG. 3 may be positioned on the same side of the preparation 38. The radiation source emits radiation in the direction of the end 52 of the tunnel tip 2 and/or the preparation 38. After reflection at the surface of the preparation 38 and, if required, absorption and emission by the preparation this radiation 40 will undergo a change. The radiation 12 detected by the tunnel tip 2 will therefore again comprise physical information about the preparation 38.

According to an embodiment the preparation 38 forms an information storage medium. The preparation may be located between the radiation source 36 and the tunnel tip 2. It is also possible, however, that tunnel tip 2 and radiation source 36 are located on the same side of the preparation 38. The information is stored in regions of the preparation the electric and/or magnetic state of which can be adjusted. In particular, each region may assume one of two different states and can therefore comprise a bit of information. Subsequently, by scanning the regions successively with the measuring device, the information stored can be recovered. The lateral resolution may be on an order of magnitude of less than the wavelength of the radiation 40 so that per surface unit large amounts of information can be stored and read.

It will be clear that many other uses of the measuring device sensitive to electromagnetic radiation, more in particular light, are conceivable, which have not been and will not be discussed here.

We claim:

1. A measuring device for measuring electromagnetic radiation, comprising:
    a body;
    a tunnel tip positionable to face the body at a separation distance less than a wavelength of the electromagnetic radiation, the tip being at least partly composed of a semiconductor material and positionable so that the electromagnetic radiation to be measured is incident on the tunnel tip;
    a control unit connected to the body and to the tunnel tip to detect one of a tunnel current and a surface photovoltage generated under influence of the electromagnetic radiation incident on the tunnel tip, the control unit generating information about the electromagnetic radiation in response to the one of the tunnel current and the photovoltage;
    wherein only a limited collection volume of the tunnel tip contributes to generation of the one of the tunnel current and the surface photovoltage under influence of the electromagnetic radiation incident on the tunnel tip, and the limited collection volume is defined by variations in transport properties of the tunnel tip.

2. A measuring device according to claim 1, wherein the body comprises a preparation for emitting radiation, at least one of intensity and polarization of the emitted radiation being determinable by the measuring device.

3. A measuring device according to claim 1, wherein the tunnel tip is provided with a metallic coating partially covering a surface of the tunnel tip.

4. A measuring device according to claim 1, wherein the control unit is provided with a voltage source to regulate the surface photovoltage within predetermined limits.

5. A measuring device according to claim 1, further comprising a radiation source to emit electromagnetic radiation a direction towards the tunnel tip, wherein one of intensity and polarization of the emitted radiation are measured by the device.

6. A measuring device according to claim 1, wherein the body comprises a preparation to be investigated, and the measuring device further comprises a radiation source to emit electromagnetic radiation in a direction towards the preparation.

7. A measuring device according to claim 6, wherein the preparation is locatable between the tunnel tip and the radiation source, so that the one of intensity and polarization of radiation transmitted by the preparation is measured for determining physical properties of the preparation.

8. A measuring device according to claim 6, wherein the radiation source and the tunnel tip are located on a same side of the preparation, so that one of intensity and polarization of radiation, where the radiation is at least partly reflected by the preparation, is detected by the tunnel tip for determining physical properties of the preparation.

9. A measuring device according to claim 8, wherein the radiation source emits polarized radiation.

10. A measuring device according to claim 9, wherein the radiation source emits linearly polarized radiation.

11. A measuring device according to claim 9, wherein the radiation source emits circularly polarized radiation.

12. A measuring device according to claim 9, wherein the radiation source is provided with a modulator for modulating a polarization direction and the control unit includes a phase-sensitive detector for phase-sensitive detection, in synchronization with the modulation, of the one of tunnel current and surface photovoltage.

13. A measuring device according to claim 12, wherein the control unit is provided with a voltage source to generate a bias voltage between the body and the tunnel tip.

14. A measuring device according to claim 1, further comprising a control unit-controlled drive for positioning the tunnel tip at a desired distance from the body and for scanning a position of the tunnel tip relative to a surface of the body.

15. A measuring device according to claim 14, wherein the body includes an information storage medium having at least one of position-dependent magnetic and electric states to represent stored information.

16. A measuring device according to claim 1, wherein the control-unit is further provided with means for varying the separation distance between the tunnel tip and the body for regulating the one of the tunnel current and the surface photovoltage to a predetermined value.

17. A measuring device according to claim 1, further comprising a radiation source to generate the electromagnetic radiation, positionable so that the electromagnetic radiation propagates from a proximal surface of the body the tunnel tip.

18. A method for measuring electromagnetic radiation, comprising
    arranging a tunnel tip to face a body, the tunnel tip at least partly composed of a semiconductor material and separated from the body by a separation distance, the electromagnetic radiation being incident on the tunnel tip;
    generating at least one of a tunnel current and a surface photovoltage under influence of electromagnetic radiation incident on the tunnel tip;
    detecting the at least one of the tunnel current and the surface photovoltage using a control unit; and
    producing information about the radiation incident on the tunnel tip in response to the detected at least one of the tunnel current and the surface photovoltage.

19. A method for measuring electromagnetic radiation according to claim 18, wherein the body comprises a preparation emitting the radiation to be measured and the radiation is transmitted to the tunnel tip for measuring one of the intensity and polarization of the radiation.

20. A method for measuring electromagnetic radiation according to claim 18, wherein information is produced about the radiation incident on the tunnel tip in response to at least one of the intensity and the polarization of the radiation.

21. A method for measuring electromagnetic radiation according to claim 18, further comprising providing the tunnel tip a metallic coating over at least part of the tunnel tip.

22. A method for measuring electromagnetic radiation according to claim 18, further comprising providing the control unit with a voltage source for regulating the surface photovoltage within predetermined limits.

23. A method for measuring electromagnetic radiation according to claim 18, further comprising providing a radiation source that emits electromagnetic radiation towards the tunnel tip for measuring at least one of the intensity and the polarization of the radiation.

24. A method for measuring electromagnetic radiation according to claim 18, wherein the body comprises a preparation to be investigated; and further comprising providing a radiation source that emits electromagnetic radiation towards the preparation for measuring the radiation after interacting with the preparation.

25. A method for measuring electromagnetic radiation according to claim 24, wherein the preparation is located between the tunnel tip and the radiation source, and further comprising measuring one of the intensity and the polarization of radiation transmitted by the preparation for determining physical properties of the preparation.

26. A method for measuring electromagnetic radiation according to claim 18, wherein the radiation source and the tunnel tip are located on a same side of the preparation and further comprising measuring at least one of the intensity and the polarization of radiation at least partly reflected by the preparation, so as to determine physical properties of the preparation.

27. A method for measuring electromagnetic radiation according to claim 26, wherein the radiation source emits polarized radiation.

28. A method for measuring electromagnetic radiation according to claim 27, wherein the radiation source emits linearly polarized radiation.

29. A method for measuring electromagnetic radiation according to claim 28, further comprising modulating a direction of polarization of radiation emitted by the the radiation source and phase-sensitively detecting the at least one of the tunnel current and the surface photovoltage in synchronization with the modulating.

30. A method for measuring electromagnetic radiation according to claim 29, further comprising generating a bias voltage between the body and the tunnel tip.

31. A method for measuring electromagnetic radiation according to claim 30, further comprising positioning the tunnel tip at a predetermined distance from the body using a control unit-controlled drive, scanning the body, where the body includes a preparation to be investigated, and measuring radiation which has interacted with the preparation.

32. A method for measuring electromagnetic radiation according to claim 31, wherein the preparation to be investigated comprises an information storage medium having one of position-dependent magnetic and electrical states to represent stored information.

33. A method for measuring electromagnetic radiation according to claim 27, wherein the radiation source emits circularly polarized radiation.

34. A method for measuring electromagnetic radiation according to claim 18, further comprising selecting transport properties of the tunnel tip so as to limit a collection volume in the body that contributes to the at least one of the tunnel current and the surface photovoltage.

35. A method for measuring electromagnetic radiation according to claim 18, further comprising propagating the electromagnetic radiation from a proximal surface of the body to the tunnel tip.

* * * * *